(12) United States Patent
Chhagan et al.

(10) Patent No.: US 6,303,447 B1
(45) Date of Patent: Oct. 16, 2001

(54) METHOD FOR FORMING AN EXTENDED METAL GATE USING A DAMASCENE PROCESS

(75) Inventors: Vijai Komar Chhagan, Belgrave (GB); Yelehanka Ramachandramurthy Pradeep, Singapore (SG); Mei Sheng Zhou, Singapore (SG); Henry Gerung, Jawatimur (ID); Simon Chooi, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/502,036

(22) Filed: Feb. 11, 2000

(51) Int. Cl.[7] .................................................. H01L 21/336
(52) U.S. Cl. ......................... 438/299; 438/183; 438/303; 438/588; 438/592; 438/652
(58) Field of Search ..................................... 438/652, 976, 438/286, 182, 183, 184, 259, 299, 301, 303, 587, 588, 592, 595, 653, 656, 657

(56) References Cited

U.S. PATENT DOCUMENTS

| 5,422,289 | 6/1995 | Pierce ........................ 437/32 |
| 5,731,239 | 3/1998 | Wong et al. .................. 438/296 |
| 5,807,779 | 9/1998 | Liaw ......................... 438/279 |
| 5,840,609 | * 11/1998 | Hyeon et al. ............... 438/299 |
| 5,856,225 | 1/1999 | Lee et al. .................. 438/291 |
| 5,856,227 | 1/1999 | Yu et al. .................... 438/305 |
| 5,869,396 | 2/1999 | Pan et al. ................... 438/647 |
| 5,915,183 | 6/1999 | Gambino et al. .............. 438/300 |
| 6,093,590 | * 7/2000 | Lou ......................... 438/197 |
| 6,177,336 | * 1/2001 | Lin et al. .................. 438/592 |
| 6,180,501 | * 1/2001 | Pey et al. .................. 438/592 |
| 6,218,716 | * 4/2001 | Wang et al. ................. 257/413 |

* cited by examiner

Primary Examiner—Charles Bowers
Assistant Examiner—Jack Chen
(74) Attorney, Agent, or Firm—George O. Saile; Rosemary L. S. Pike; William J. Stoffel

(57) ABSTRACT

A method for forming an extended metal gate without poly wrap around effects. A semiconductor structure is provided having a gate structure thereon. The gate structure comprising a gate dielectric layer, a gate silicon layer, a doped silicon oxide layer, and a disposable gate layer stacked sequentially. Spacers are formed on the sidewalls of the gate structure. A dielectric gapfill layer is formed over the semiconductor structure and the gate structure and planarized, stopping on the disposable gate layer. A first silicon nitride layer is formed over the disposable gate layer, and a dielectric layer is formed over the first silicon nitride layer. The dielectric layer is patterned to form a trench over the gate structure; wherein the trench has a width greater than the width of the gate structure. The first silicon nitride layer in the bottom of the trench and the disposable gate layer are removed using one or more selective etching processes. The doped silicon oxide layer is removed using an etch with a high selectivity of doped silicon oxide to undoped silicon oxide. A barrier layer is formed over the gate silicon layer, and a metal gate layer is formed on the barrier layer; whereby the metal gate layer has a greater width than the gate structure.

21 Claims, 9 Drawing Sheets

METHOD FOR FORMING AN EXTENDED METAL GATE USING A DAMASCENE PROCESS

BACKGROUND OF INVENTION

1) Field of the Invention

This invention relates generally to fabrication of a semiconductor device and more particularly to a method for forming a self-aligned, extended metal gate using a damascene process.

2) Description of the Prior Art

As semiconductor geometries continue to shrink, and design requirements demand faster performance, gate contact resistance becomes increasingly important to reduce the circuit delay. Metal gates are an attractive option for reducing gate contact resistance, however, several problems prevent economical commercial manufacturing of metal gates.

Etching the top layer of a gate structure to expose form an opening for a metal gate layer can cause erosion of the adjacent dielectric material (eg gapfill layer or STI). This erosion of the gapfill layer can cause poly wrap around effects wherein a higher electrical field is created where a polysilicon layer fills in the gap caused by the erosion, increasing the risk of poly breakdown.

Another problem associated with forming metal gates as gate geometries continue to shrink is that patterning accuracy is reduced by performing photolithography on non-planar surfaces. Because prior art processes for forming metal gates require photolithography steps to be performed on non-planar surfaces, the necessary patterning accuracy is difficult to achieve.

Also, as gate geometries continue to shrink, it becomes difficult to land contacts on the gate structure. To compensate for this, dogbone structures that extend over field isolation structures are formed to provide increase area for landing contacts. However these dogbone structures increase contact resistance causing circuit delay.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,422,289 (Pierce) shows a planarized source and drain and gate contact structure.

U.S. Pat. No. 5,856,227 (Yu et al.) shows a polycide gate process formed by ion implant through a thin residual polysilicon layer, followed by oxidation of the thin residual polysilicon layer.

U.S. Pat. No. 5,915,183 (Gambino et al.) shows a raised source and drain contact using recessed etch of a blanket polysilicon layer.

U.S. Pat. No. 5,807,779 (Liaw) shows a process for forming self-aligned source and drain contacts and local interconnect structures.

U.S. Pat. No. 5,869,396 (Pan et al.) shows a method for forming a polycide gate contact.

U.S. Pat. No. 5,856,225 (Lee et al.) shows a process for forming an implanted channel region by removing a dummy gate to form an implant opening and forming a self-aligned gate in the opening.

U.S. Pat. No. 5,731,239 (Wong et al.) shows a method for forming sclf-aligned silicide gate electrodes.

SUMMARY OF THE INVENTION

It is an object of the present invention to provide a method for forming an self-aligned, extended metal gate using a damascene process.

It is another object of the present invention to provide an integrated method for forming a self-aligned, extended metal gate and self-aligned metal source and drain contacts with a single mask and etching step.

It is another object of the present invention to provide a method for eliminating the poly wrap-around effect at the STI/source and drain junction.

It is yet another object of the present invention to provide a method for forming an extended self-aligned gate with reduced topography variation during photolithography.

To accomplish the above objectives, the present invention provides a method for forming an extended metal gate without poly wrap around effects. The method begins by providing a semiconductor structure having a gate structure thereon. The gate structure comprising a gate dielectric layer, a gate silicon layer, a doped silicon oxide layer, and a disposable gate layer stacked sequentially. Spacers are formed on the sidewalls of the gate structure. A dielectric gapfill layer is formed over the semiconductor structure and the gate structure and planarized, stopping on the disposable gate layer. A first silicon nitride layer is formed over the disposable gate layer, and a dielectric layer is formed over the first silicon nitride layer. The dielectric layer is patterned to form a trench over the gate structure; wherein the trench has a width greater than the width of the gate structure. The first silicon nitride layer in the bottom of the trench and the disposable gate layer are removed using one or more selective etching processes. The doped silicon oxide layer is removed using an etch with a high selectivity of doped silicon oxide to undoped silicon oxide. A barrier layer is formed over the gate silicon layer, and a metal gate layer is formed on the barrier layer; whereby the metal gate layer has a greater width than the gate structure.

The present invention provides considerable improvement over the prior art. Extended metal gates allow for increased tolerance for landing gate contacts, eliminating the need for dogbone structures over the field isolation structures. Because the present invention provides high selectivity of the doped silicon layer in the gate structure to the undoped silicon of the gapfill layer, poly wrap around effects can be avoided. Also, since each photolithography step is performed on a planar topography, the photolithography process error can be reduced, increasing the patterning accuracy.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 7A through 11A illustrate sequential top views of a second embodiment of a process for forming a self-aligned extended metal gate according to the present invention.

FIGS. 7B through 11B and 12 through 16 illustrate sequential sectional views of the second embodiment of a process for forming a self-aligned extended metal gate according to the present invention, wherein FIG. 7B is taken along axis 7B–7B' as shown in FIG. 7A.

DETAILED DESCRIPTION OF THE INVENTION

The present invention will be described in detail with reference to the accompanying drawings. The present invention provides a method for forming a self-aligned extended metal gate. The present invention can also provide a method for forming a self-aligned extended metal gate and self-aligned source/drain contacts.

First Preferred Embodiment

Figure 1:
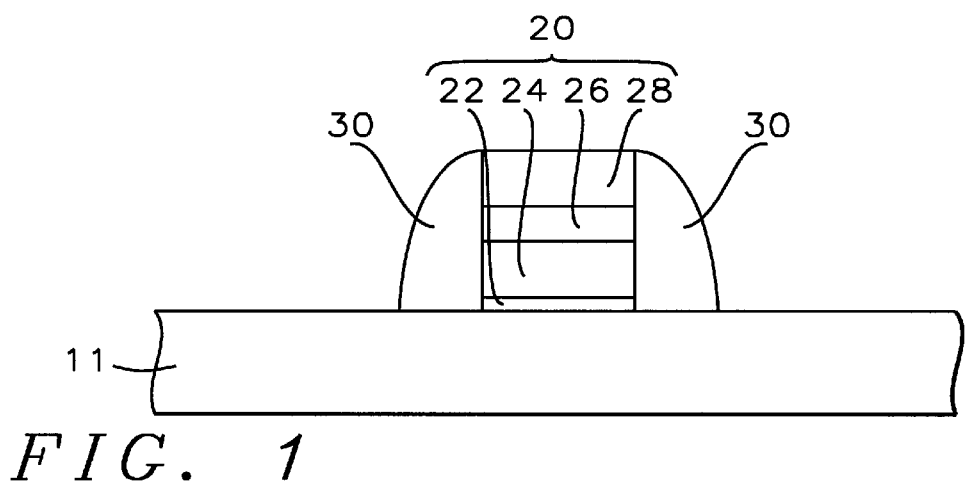
FIGS. 1 through 6B illustrate sequential sectional views of a first embodiment of a process for forming an self-aligned extended metal gate according to the present invention.

Referring to FIG. 1, the first preferred embodiment of the present invention begins by providing a semiconductor structure (11). Semiconductor structure (11) should be understood to possibly comprise a wafer or substrate of semiconducting material such as silicon or germanium, a silicon on insulator structure (SOI), or other like structure as is known in the art. Semiconductor structure (11) should be understood to possibly further comprise one or more conductive and/or insulating layers overlying a substrate or the like, and one or more active and/or passive devices formed in or over a substrate or the like.

Still referring to FIG. 1, a gate structure (20) is formed on the semiconductor structure (11). The gate structure preferably comprises a gate dielectric layer (22) formed on the semiconductor structure (11), a gate silicon layer (24) formed on the gate dielectric layer (22), a doped silicon oxide layer (26) formed on the gate polysilicon layer (24), and a disposable gate layer (28) formed on the doped silicon oxide layer (26). The gate dielectric layer (22) typically comprises silicon oxide, but can be formed using any suitable dielectric material. The gate dielectric layer (22) preferably has a thickness of between about 10 Angstroms and 200 Angstroms, and a dielectric constant greater than 3. The gate silicon (24) layer can be amorphous silicon (α-silicon) or polycrystalline silicon (polysilicon) and is preferably formed to a thickness of between about 300 Angstroms and 3,00 Angstroms. The doped silicon oxide layer (26) preferably comprises phosphosilate glass (PSG) or borophosphosilicate glass (BPSG) formed to a thickness of between about 100 Angstroms and 2,000 Angstroms using a chemical vapor deposition (CVD) eg. PECVD or HDP-CVD or SACVD process with a dopants such as trimethylborate or triethylphoshate or both. The disposable gate layer (28) can comprise silicon nitride or polysilicon, and preferably has a thickness of between about 100 Angstroms and 2,00 Angstroms for silicon nitride or a thickness of between about 100 Angstroms and 2,000 Angstroms for polysilicon.

Still referring to FIG. 1, the gate dielectric layer (22), the gate silicon layer (24), the doped silicon oxide layer (26), and the disposable gate layer (28) are patterned to form a gate structure (20) having sidewalls. The gate structure can be formed using photolithography (eg form photoresist layer, expose photoresist layer through a reticle or pattern, develop photoresist to form a photoresist mask, etch the underlying layers through the photoresist mask, and remove the photoresist mask). Dielectric spacers (30) are formed on the sidewalls of the gate structure (20), through blanket deposition of the dielectric followed by anisotropic etching. The dielectric for the spacers (30) is preferably comprised of silicon nitride.

Figure 2:
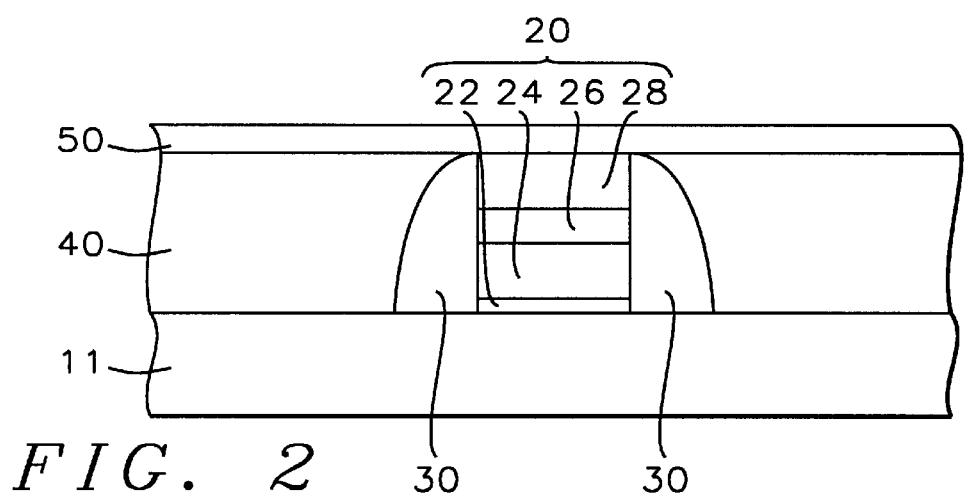

Referring to FIG. 2, a gapfill layer (40) is formed over the semiconductor structure (11) and planarized, stopping on the disposable gate layer (28). The gapfill layer (40) preferably comprises undoped silicon oxide, and is preferably planarized using a chemical-mechanical polishing process (CMP).

Still referring to FIG. 2, a first silicon nitride layer (50) is formed over the disposable gate layer (28) and the gapfill layer (40). The first silicon nitride layer can be formed using a APCVD, PECVD, or most preferably a LPCVD process. The first silicon nitride layer (50) preferably has a thickness of between about 100 Angstroms and 2,000 Angstroms.

Figure 3:
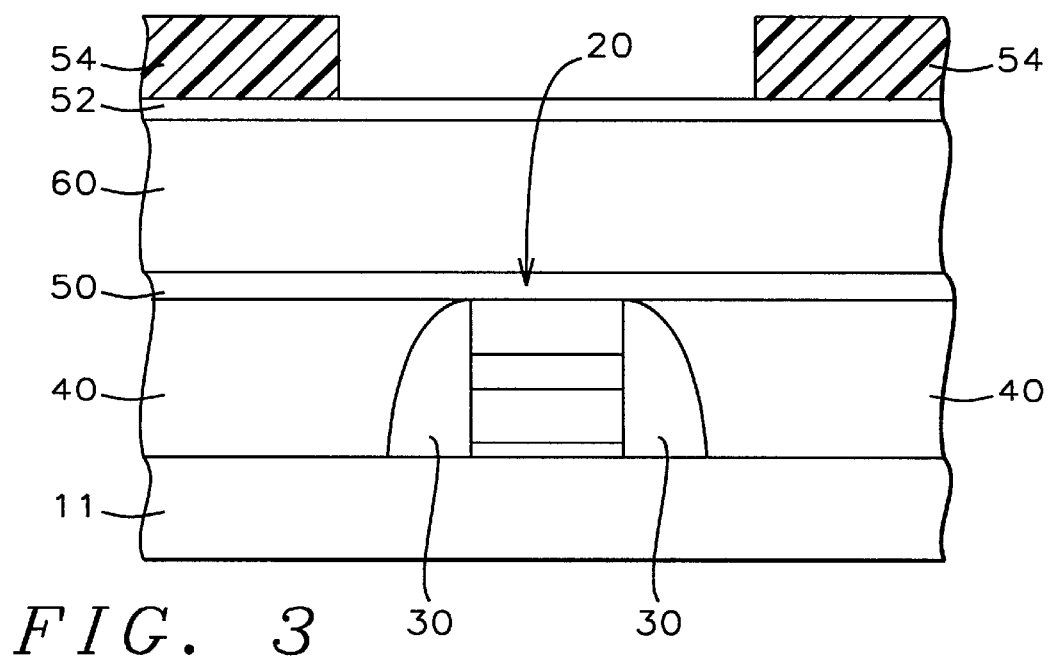

Referring to FIG. 3, a dielectric layer (60) is formed over the first silicon nitride layer (50). The dielectric layer (60) preferably comprises silicon oxide, but can comprise any material having the appropriate dielectric properties and etch selectivity to the first silicon nitride layer (50). A second silicon nitride layer (52) can be formed on the dielectric layer (60) to protect the dielectric layer (60) during etching.

Figure 4:
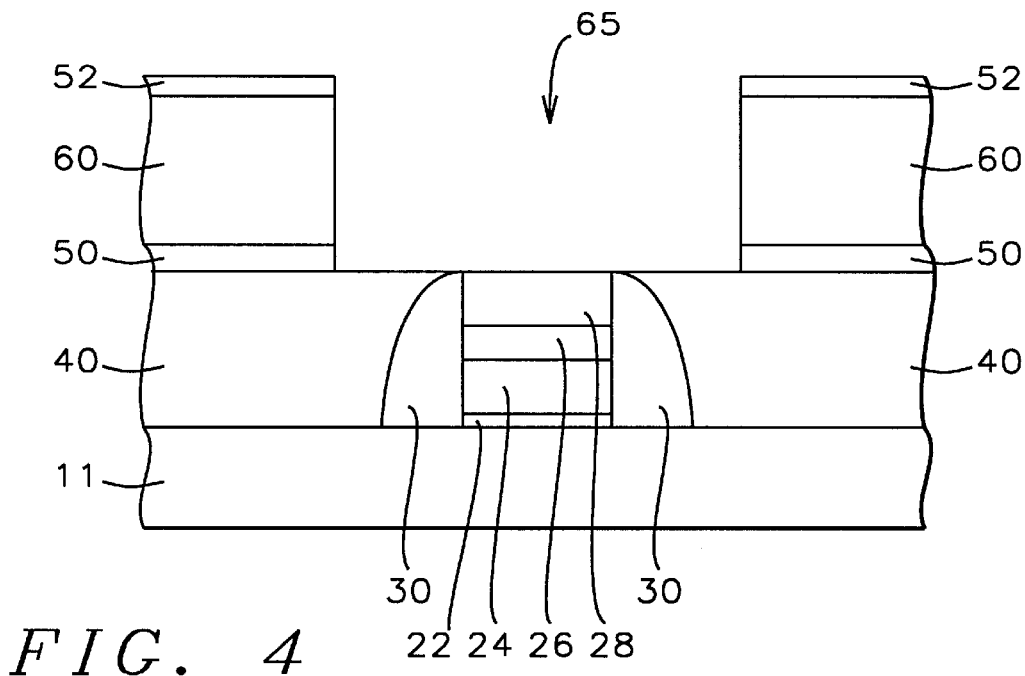

The dielectric layer is patterned to form a trench (65) having a width greater than the gate structure (20), as shown in FIG. 4. The dielectric layer is preferably patterned by forming a photoresist mask (54) as shown in FIG. 3, and etching the second silicon nitride layer (52), the dielectric layer (60), and the first silicon nitride layer (50) through the photoresist mask (54). For a disposable gate layer (28) comprising silicon nitride, the disposable gate layer will be removed with the first silicon nitride layer (50) during etching. For a disposable gate layer comprising polysilicon, the disposable gate layer will remain following removal of the first silicon nitride layer, as shown in FIG. 4.

Figure 5:
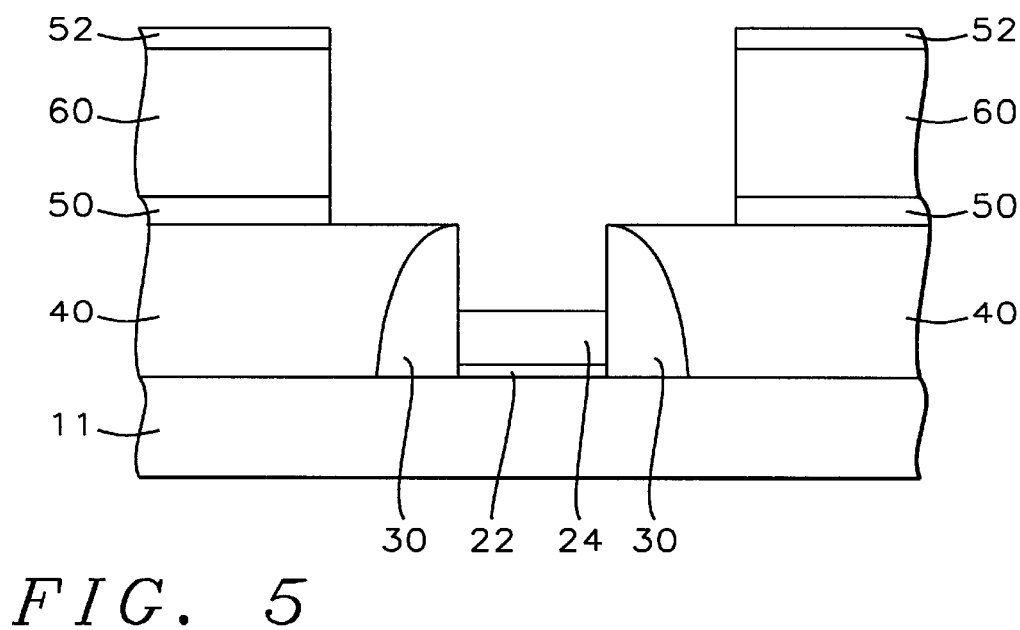

Referring to FIG. 5, if the disposable gate layer (28) comprises polysilicon, it can be removed using a dry etch (eg plasma assisted etching) selective to undoped and doped silicon oxide and silicon nitride using $Hbr/Cl_2/He—O_2$. The dry etch has a selectivity of polysilicon to undoped silicon oxide of at least 2:1 a selectivity of polysilicon to doped silicon oxide of at least 2:1 and a selectivity of polysilicon to silicon nitride of at least 2:1. The doped silicon oxide layer (26) is removed using an etch with a high selectivity of doped silicon oxide to undoped silicon oxide. The etch is preferably a wet anhydrous vapor HF etch with a doped silicon oxide to undoped silicon oxide of greater than 50:1.

A key advantage of the present invention is that the high selectivity of the doped silicon oxide etch prevents erosion of the undoped silicon oxide in the gapfill layer (40) which is exposed to the etch in the bottom of the trench beyond the dielectric spacers.

Figure 6A:
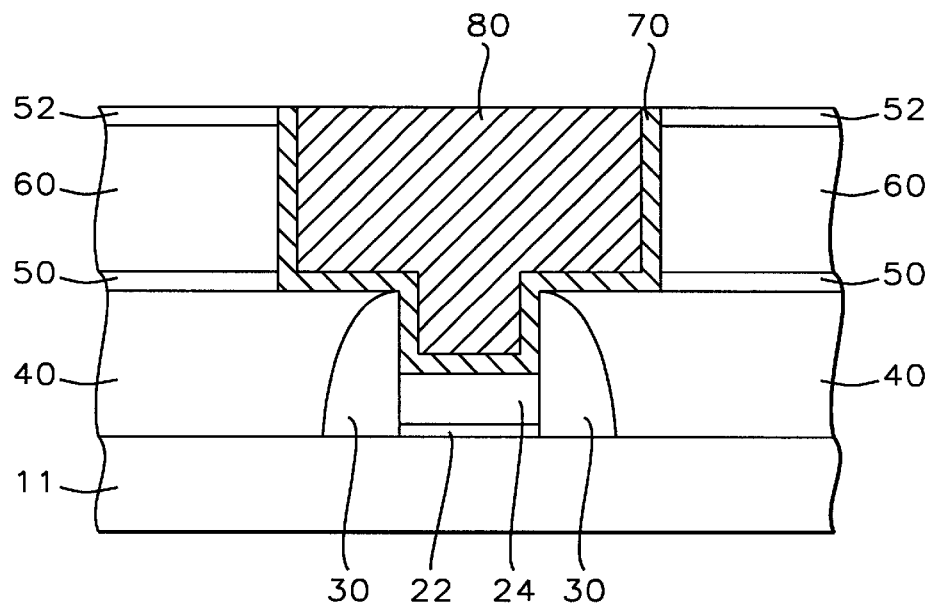

Referring to FIG. 6A, a barrier layer (70) is formed over the gate polysilicon layer (24). The barrier layer comprises one or more of the following: titanium, titanium nitride, tungsten nitride and tantalum or tantalum nitride, formed to a thickness of between about 50 Angstroms and 2,000 Angstroms. A metal gate layer (80) is then formed on the barrier layer. The metal in metal gate layer (80) comprises tungsten or aluminum or aluminum alloy (eg. Aluminum-copper) or copper or a combination comprising two or more of the said metals. The metal gate layer (80) and the barrier Layer (70) are then subjected to a chemical mechanical polishing (CMP), with the second silicon nitride layer (52)

acting as a polishing stop. The metal gate layer (80) has a greater width than the gate structure (20), where it is formed in the trench (65). This self-aligned, extended metal gate is easier to land contacts on then a narrow gates in the prior art.

Figure 6B:
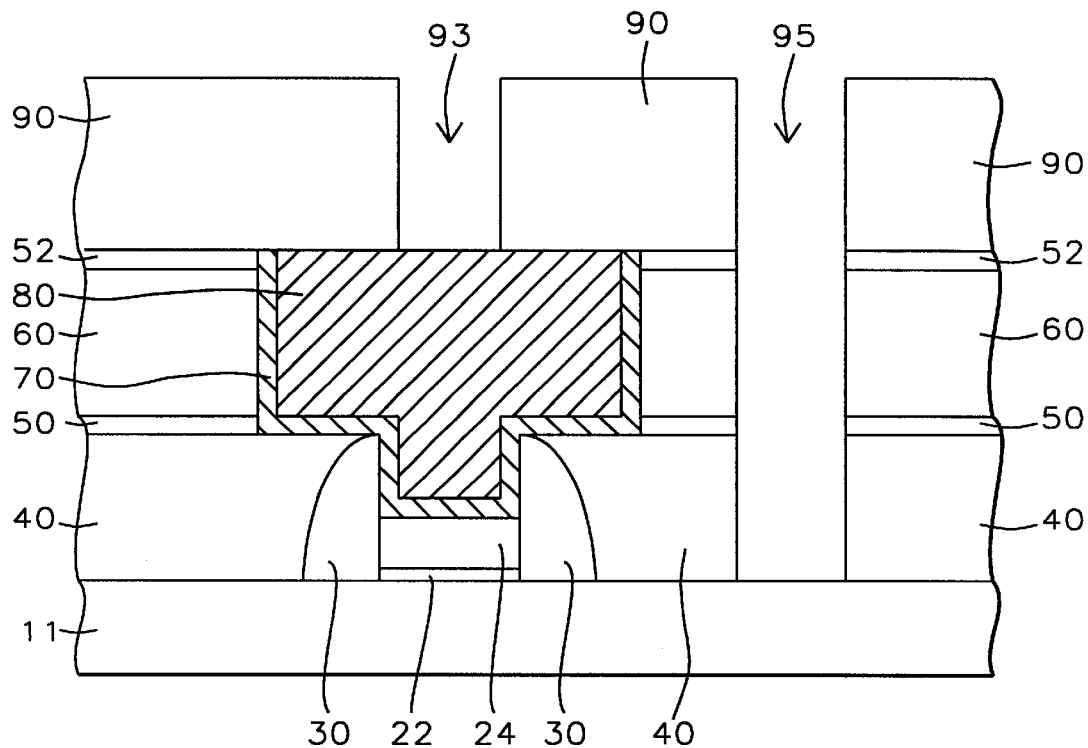

Referring to FIG. 6B, a second dielectric layer (90) is formed over the gate metal layer and the second nitride layer. The second dielectric layer comprises undoped silicon oxide or doped silicon oxide or other suitable material. The second dielectric layer (90) is patterned to form metal gate contact openings (93) and source and drain contact openings (95). The source and drain contact openings are extended through the second dielectric layer (90), the second silicon nitride layer (52), the first dielectric layer (60), the first silicon nitride layer (50) and the gapfill layer (40).

Second Preferred Embodiment

Figure 7A:
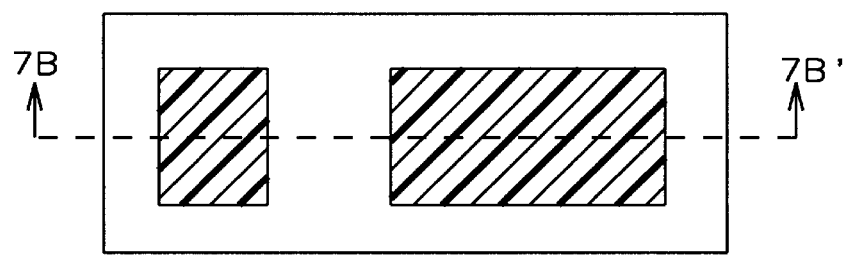
Figure 7B:
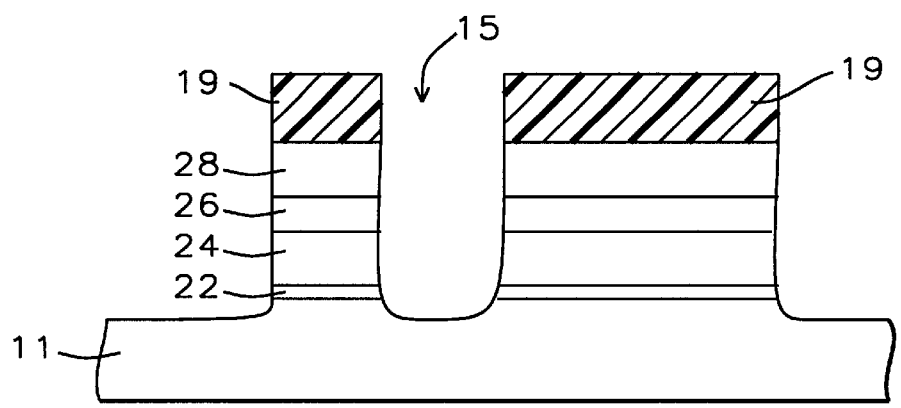

Referring to FIGS. 7A and 7B, a second preferred embodiment of the invention begins by providing a semiconductor structure (11). As with the first preferred embodiment, the term semiconductor structure should be understood to be descriptive and is not intended as a limitation. Semiconductor structure (11) can be a wafer of semiconducting material such as silicon, or a like structure as is known in the art.

Still referring to FIGS. 7A and 7B, a gate dielectric layer (22), a gate silicon layer (24), a doped silicon oxide layer (26), and a disposable gate layer (28) are sequentially formed over the semiconductor structure (11). The gate dielectric layer (22) preferably comprises silicon oxide having a thickness of between about 10 Angstroms and 200 Angstroms, but can comprise other materials having the desired dielectric constant of greater than three (eg. silicon nitride, tantalum oxide). The gate silicon layer (24) can comprise polycrystalline silicon (polysilicon) or amorphous silicon (α-silicon) preferably deposited to a thickness of between about 300 Angstroms and 3,000 Angstroms using a LPCVD process. The doped silicon oxide layer (26) preferably comprises of PSG or BPSG, is preferably formed to a thickness of between about 100 Angstroms and 2,000 Angstroms using a chemical vapor deposition (eg. PECVD, HDP-CVD or SACVD) process with dopants such as triethylborate or triethylphosphate or both. The disposable gate layer (28) preferably comprises silicon nitride, and preferably has a thickness of between about 100 Angstroms and 2,000 Angstroms.

Still referring to FIGS. 7A and 7B, the disposable gate layer (28), the doped silicon oxide gate layer (26), the gate silicon layer (24), the gate dielectric layer (22) and the semiconductor structure (11) are patterned to form an isolation trench (15). The isolation trench preferably has a depth of between 1,000 Angstroms and 5,000 Angstroms below the top surface of the semiconductor substrate. The disposable gate layer (28), the doped silicon oxide gate layer (26), the gate silicon layer (24), the gate dielectric layer (22) and the semiconductor structure (11) can be patterned by forming an isolation etch mask (19) over the disposable gate layer (28) using photolithography. If the disposable gate layer (28) comprises silicon nitride, the isolation etch mask (19) can be removed following etching of the disposable gate layer (28), and the remaining layers can be etched through the opening etched in the disposable gate layer (28). In this context, silicon nitride acts as a hardmask. Alternatively, the isolation etch mask (19) can be removed following completion of the isolation trench (15). An advantage of the present invention is that the topography is flat, which provides more accurate control of the photolithography process.

Figure 8A:
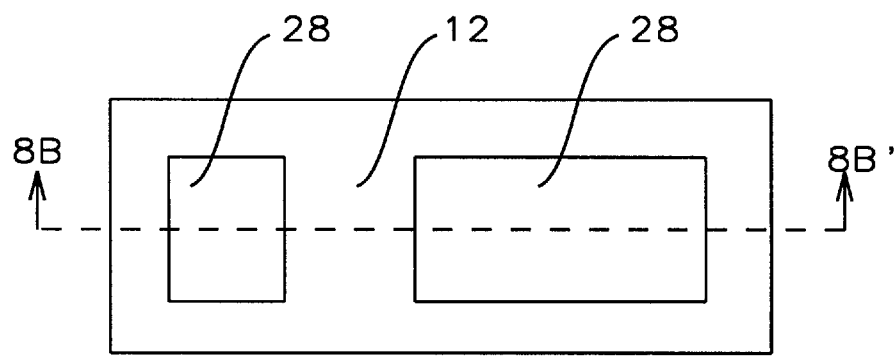
Figure 8B:
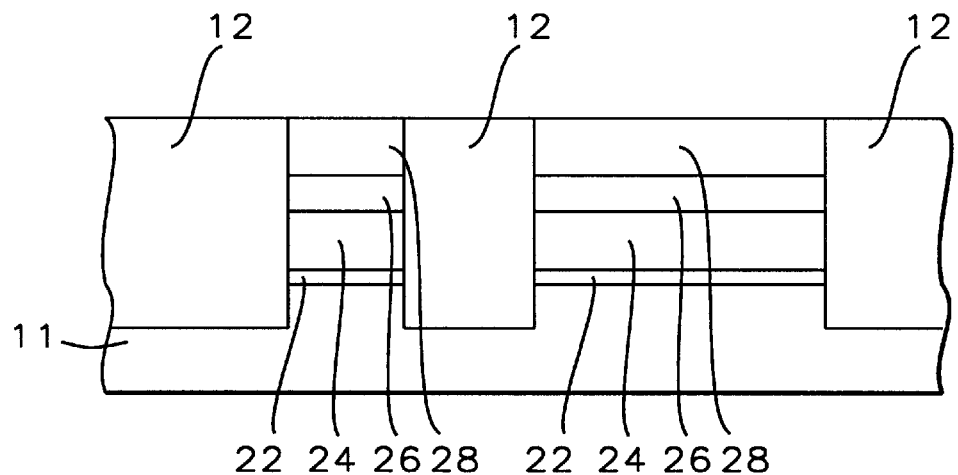
FIG. 8B is taken along axis 8B–8B' as shown in FIG. 8A.

Referring to FIGS. 8A and 8B, shallow trench isolation (STI) structures (12) are formed in the isolation trench (15) by depositing and planarizing a dielectric layer such as silicon oxide. The STIs (12) are preferably planarized using a chemical-mechanical polishing process, stopping on the disposable gate layer (28).

Figure 9A:
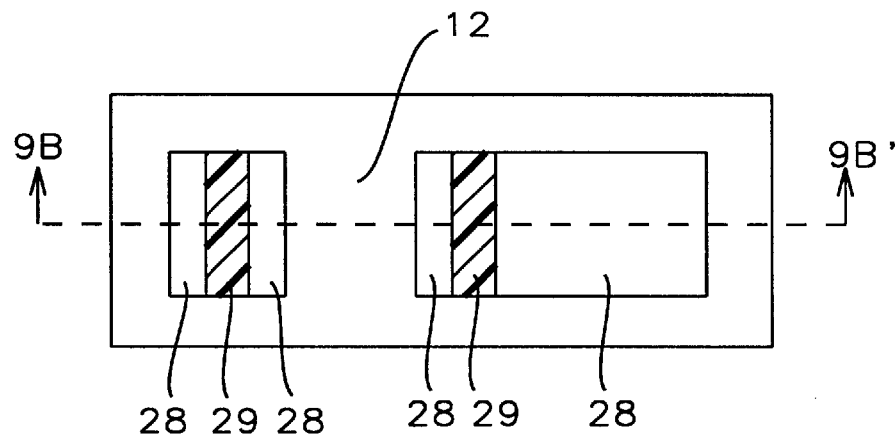
Figure 9B:
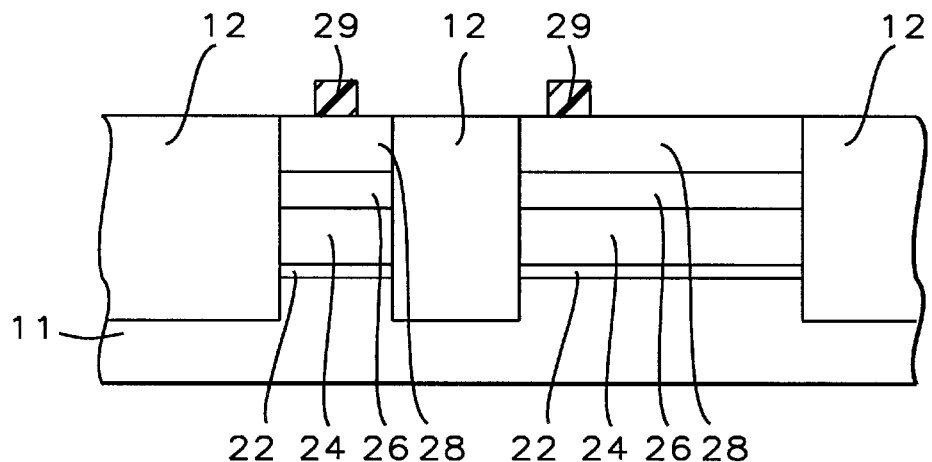
FIG. 9B is taken along axis 9B–9B' as shown in FIG. 9A.
Figure 10A:
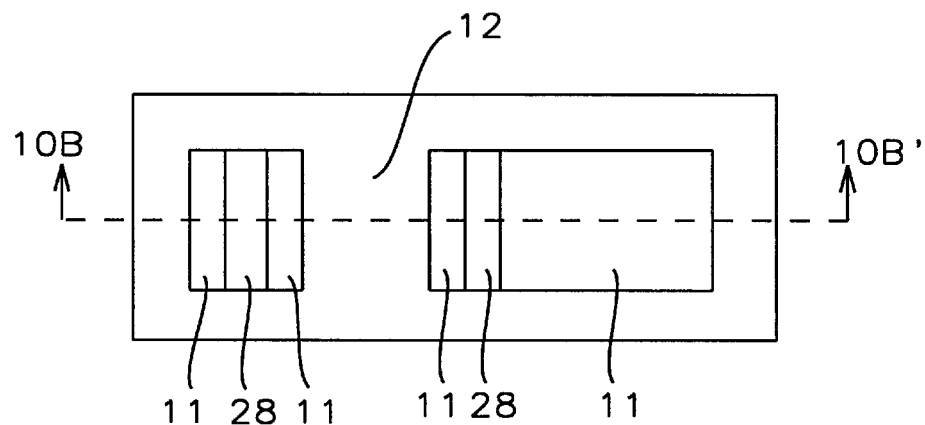
Figure 10B:
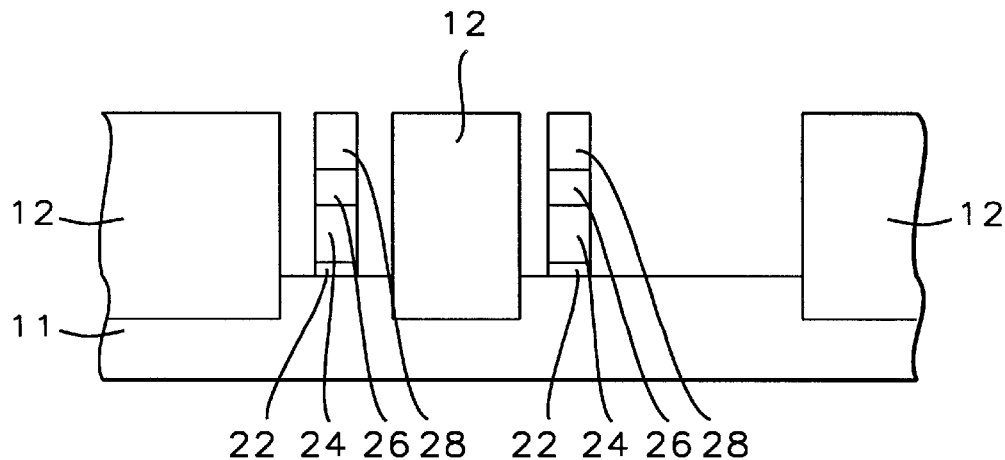
FIG. 10B is taken along axis 10B–10B' as shown in FIG. 10A, and FIG. 11B and FIGS. 12 through 16 are taken along axis 11B–11B' as shown in FIG. 11A.

Referring to FIGS. 9A, 9B, 10A and 10B, the disposable gate layer (28), the doped silicon oxide gate layer (26), the gate silicon layer (24), and the gate dielectric layer (22) are patterned to form gate structures (20). A gate etch mask (29) is formed on the disposable gate layer (28), as shown in FIGS. 9A and 9B. The gate etch mask (29) preferably comprises photoresist formed using a photolithography process. Again, the topography is flat during photolithography, enhancing the accuracy of the photolithography process and the resulting gate width.

The disposable gate layer (28), the doped silicon oxide gate layer (26), the gate silicon layer (24), and the gate dielectric layer (22) are etched through the openings in the gate etch mask (29) to form gate structures (20) having sidewalls. The etching chemistries used in the patterning of the gate structure 20 include: $SF_6/O_2/HBR$, or $CF_4/O_2/HBR$, or $C2F_6/O_2/HBR$ (for the etching of silicon nitride (28), $CF_4/CHF_3$ (for doped silicon oxide gate layer (26), $HBR/CL_2/He-O_2$ (for the etching of gate silicon layer (24)) and HF vapor (for the etching of gate dielectric layer (22)). A key advantage of the present invention is that the doped silicon oxide layer (26) can be etched selectively to the STIs (12) using an wet anhydrous HF etch.

Figure 11A:
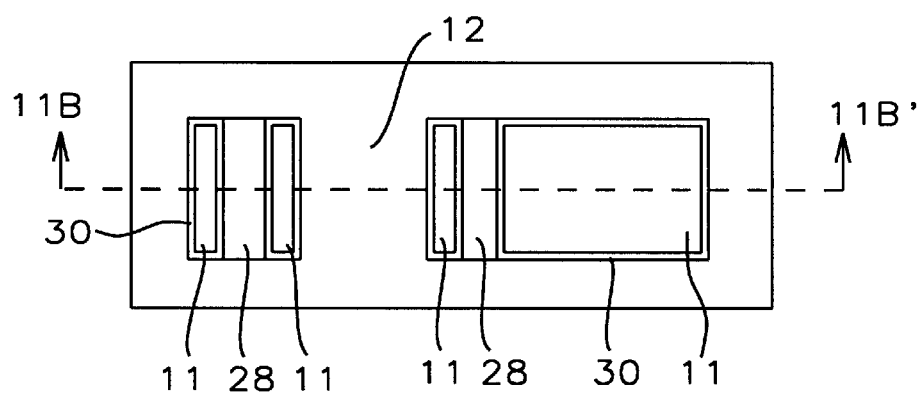
Figure 11B:
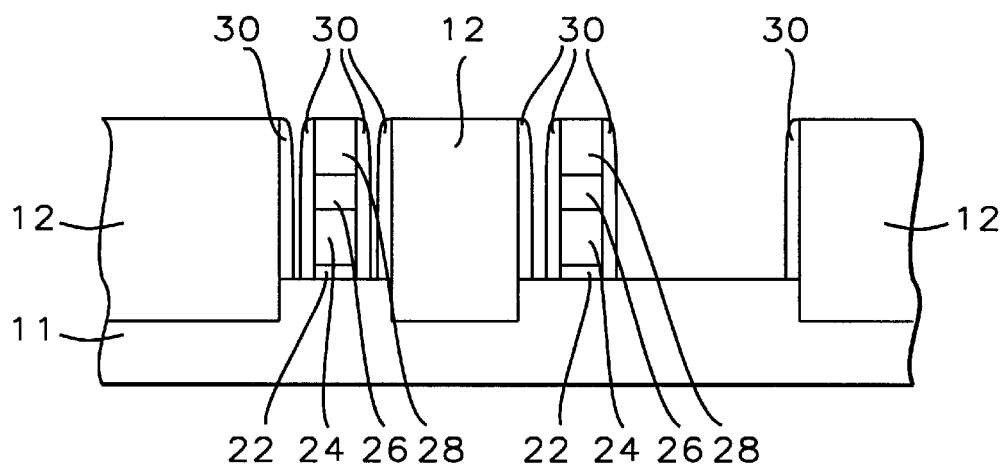

Referring to FIGS. 11A and 11B, spacers (30) are formed on the sidewalls of the gate structures (20) and the STIs (12). The spacers preferably comprise silicon nitride, and are preferably formed by a blanket deposition of silicon nitride and an anisotropic etch.

Figure 12:
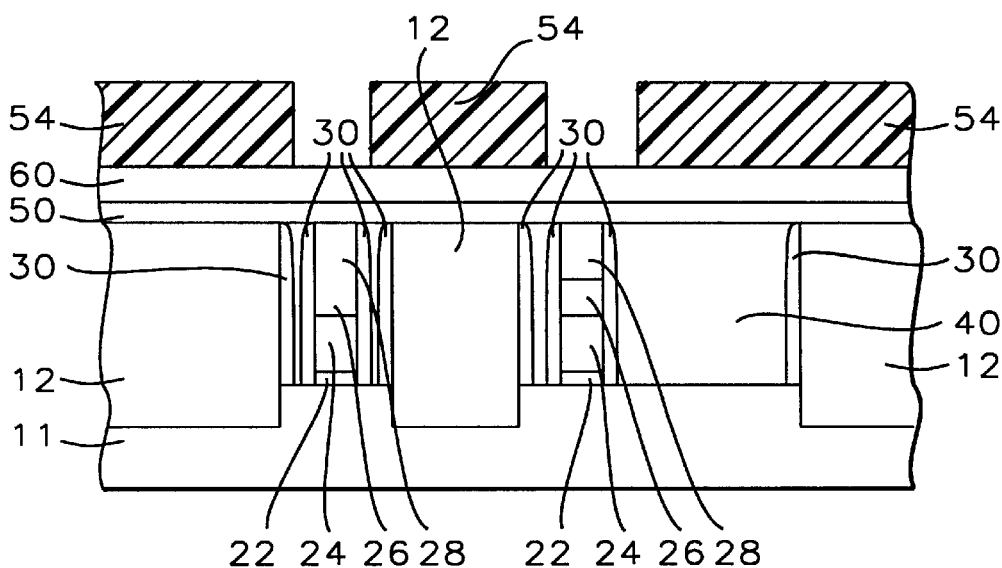

Referring to FIG. 12, a gapfill layer (40) is formed over the semiconductor structure (11) and planarized, stopping on the disposable gate layer (28). The gapfill layer preferably comprises undoped silicon oxide, and is preferably planarized using a chemical-mechanical polishing process.

Still referring to FIG. 12, a first silicon nitride layer (50) is formed over the gapfill layer (40) and the gate structures (20). A dielectric layer (60) is formed on the first silicon nitride layer (50). The first silicon nitride layer (50) can be formed using a APCVD, PACVD, or most preferably a LPCVD process, and is preferably formed to a thickness of between about 100 Angstroms and 2,000 Angstroms. The dielectric layer (60) preferably comprises undoped silicon oxide, which can be formed using a CVD process. The dielectric layer preferably has a thickness of between about 500 Angstroms and 5,000 Angstroms.

Still referring to FIG. 12, a photoresist mask (54) is formed over the dielectric layer (60) using photolithography. The photoresist mask (54) has openings over the gate structures (20); wherein the openings in the photoresist mask (54) have a width greater than the width of the gate structures (20). An advantage of the present invention is that the dielectric layer (60) has a planar topography providing for an accurate photolithography process.

Figure 13:
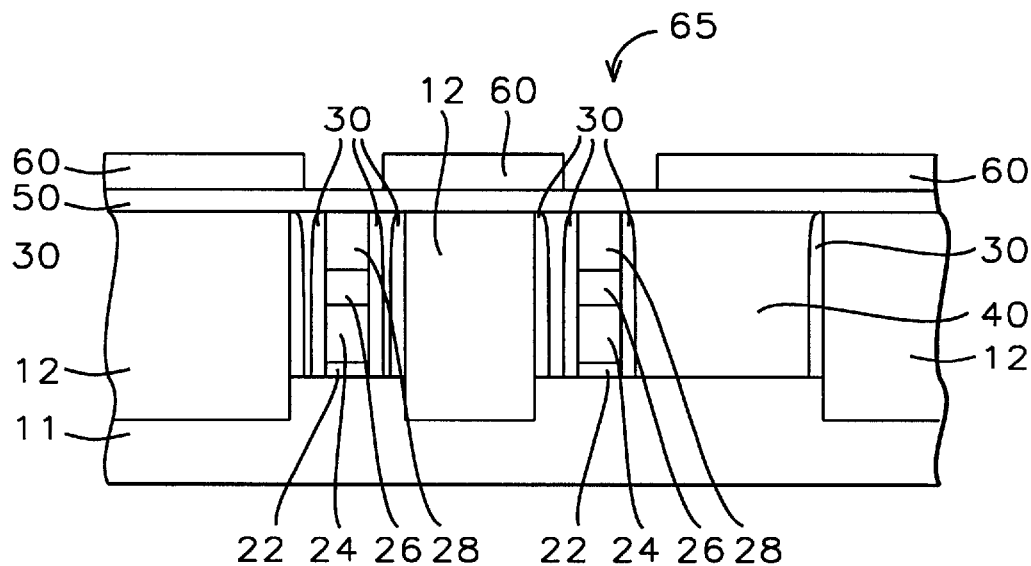

Referring to FIG. 13, the dielectric layer (60) is patterned to form trenches (65) by etching the dielectric layer (60) through the openings in the photoresist mask (54), stopping on the first nitride layer (50). The dielectric layer (60) is patterned using an etch selective to silicon nitride, such as >10:1. Following formation of the trenches (65), the photoresist mask (54) can be removed using an ashing process as is shown in FIG. 13.

Figure 14:
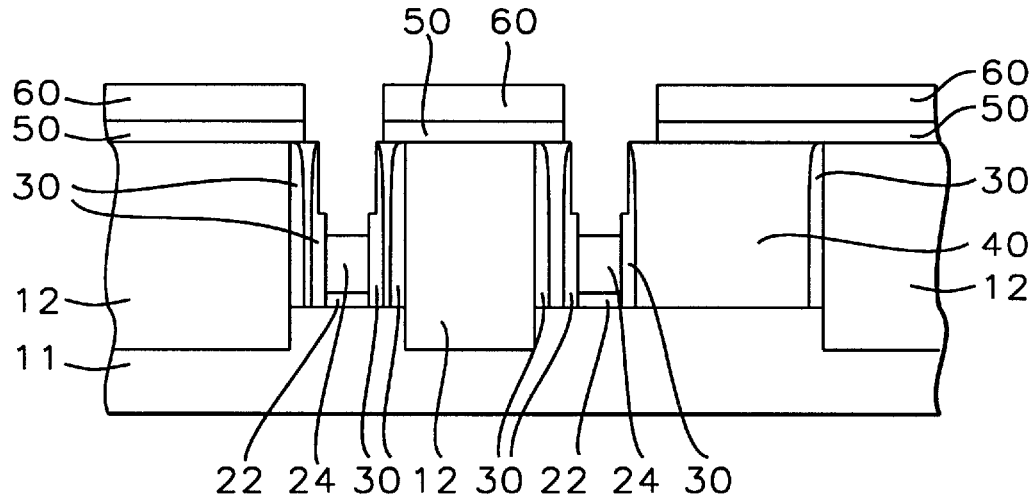

Referring to FIG. 14, the first silicon nitride layer (50) exposed in the bottom of the trenches (65) and the disposable gate layer (28) are removed using an etch with a high selectivity of silicon nitride to silicon oxide such as a plasma etch with a HBR/CL$_2$/O$_2$, or CH$_2$F$_2$/O$_2$, or CH$_3$F/O$_2$ chemistry or a hot phosphoric acid etch. An anisotropic plasma etch is preferred because it will leave a portion of the spacers (30) underlying a corner of the gapfill layer (40), which will help to prevent metal diffusion of the subsequently formed metal gate.

Still referring to FIG. 14, the doped silicon oxide layer (26) is removed using a wet anhydrous HF etch having a selectivity of doped silicon oxide to undoped silicon oxide of greater than 50:1. A key advantage of the present invention is that the wet anhydrous HF etch does not significantly etch the exposed portions of the gapfill layer (40) at the edges of the trenches (65), avoiding poly wrap around effects.

Figure 15:
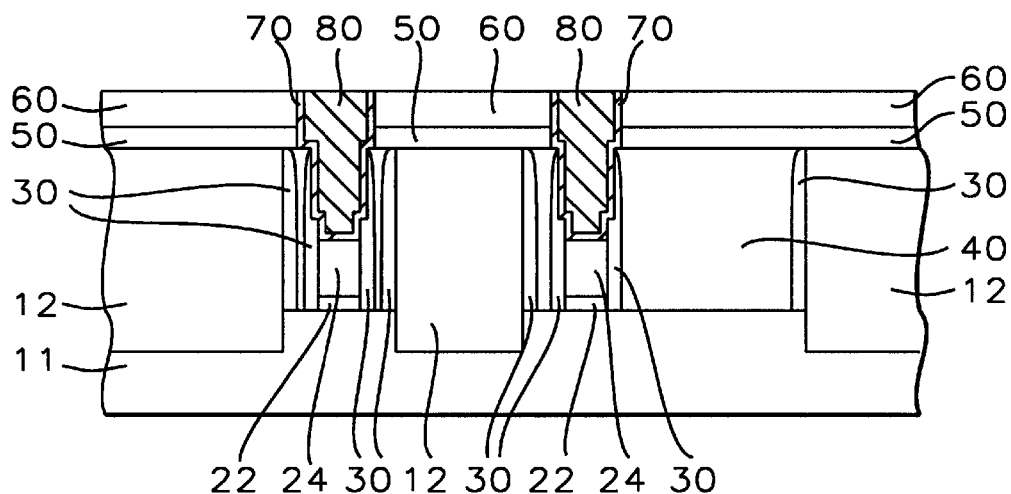

Referring to FIG. 15, a barrier layer (70) is formed on the exposed areas of the gate silicon layer (24), the spacers (30), and the gapfill layer (40). The barrier layer (70) comprises one or more of the following: titanium, titanium nitride, tantalum or tantalum nitride and preferably has a thickness of between about 50 Angstroms and 2,000 Angstroms. A metal gate layer (80) is formed on the barrier layer (70). The metal gate layer (80) can comprise one of a variety of conductive metals such as tungsten or aluminum (elemental or alloyed) or copper.

Still referring to FIG. 15, the metal gate layer (80) and the barrier layer (70) are planarized using a chemical-mechanical polishing process, stopping on the dielectric layer (60). The resulting metal gate layer (80) extends beyond the original gate structure (20) to form an extended metal gate having a top metal width greater than the gate structure width. A key advantage of the present invention is that the extended metal gate provides a greater area for landing gate contacts, eliminating the need for "dogbone" structures on the field dielectric. This also allows the two active areas to be placed closer. Hence, efficient use of silicon area/or improved pattern density.

Figure 16:
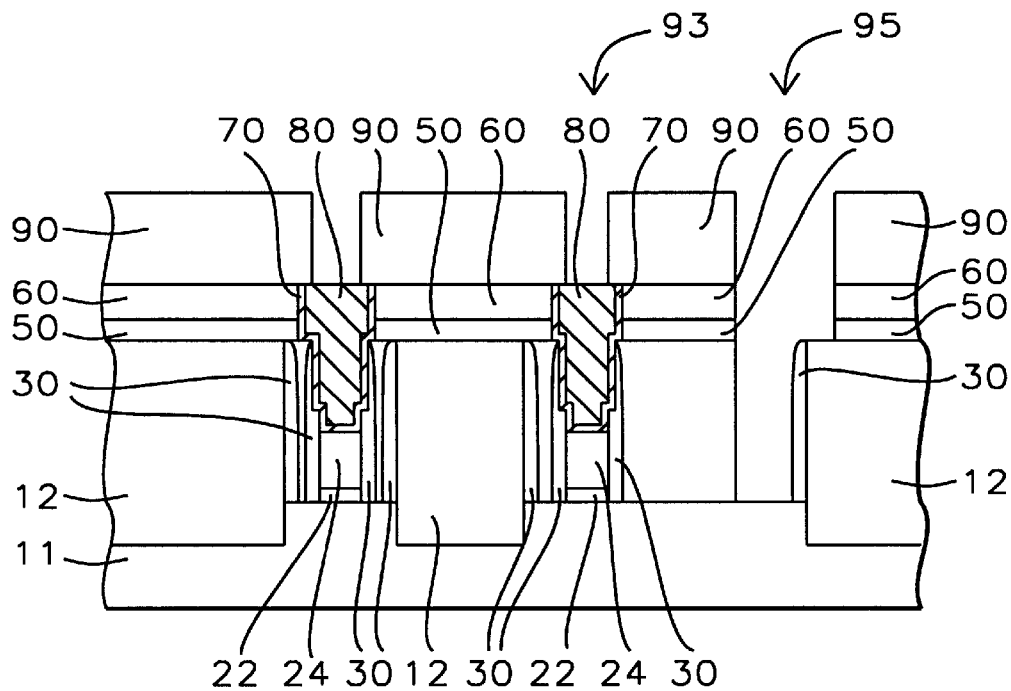

Referring to FIG. 16, a second dielectric layer (90) is formed over the gate metal layer (80) and said first dielectric layer (60). The second dielectric layer comprises undoped silicon oxide or doped silicon oxide or other suitable material. The second dielectric layer is patterned to form gate contact openings (93) and source and drain contact openings (95). The source and drain contact openings are extended through the dielectric layer (60), the first silicon nitride layer (50) and the gapfill layer (40). The source and drain contact openings can be self aligned by the silicon nitride spacers (30) formed on the STIs (12).

While the invention has been particularly shown and described with reference to the preferred embodiments thereof, it will be understood by those skilled in the art that various changes in form and details may be made without departing from the spirit and scope of the invention.

What is claimed is:

1. A method for forming an extended metal gate, comprising the steps of:

a. providing a semiconductor structure having a gate structure thereon having sidewalls; said gate structure comprising a gate dielectric layer on said semiconductor structure, a gate silicon layer on said gate dielectric layer, a doped silicon oxide layer on said gate silicon layer, and a disposable gate layer on said doped silicon oxide layer; said gate structure having spacers on said sidewalls of said gate structure;

b. forming dielectric spacers on said sidewalls of said gate structure;

c. forming a dielectric gapfill layer over said semiconductor structure and said gate structure, and planarizing said dielectric gapfill layer stopping on said disposable gate layer;

d. forming a first silicon nitride layer over said disposable gate layer;

e. forming a first dielectric layer over said first silicon nitride layer, f. forming a second silicon nitride layer over said first dielectric layer:

g. patterning said first dielectric layer and said second silicon nitride layer to form a trench over said gate structure; said trench having a width greater than a width of said gate structure;

h. removing said first silicon nitride layer in the bottom of said trench; whereby said disposable gate layer is exposed i. removing said disposable gate layer, and removing said doped silicon oxide layer; whereby said gate silicon layer is exposed;

j. forming a barrier layer over said gate silicon layer; and k. forming a metal gate layer on said barrier layer, and in said trench; whereby said metal gate layer has a greater width than said gate structure.

2. The method of claim 1 wherein said gate dielectric layer comprises a material having dielectric constant of greater than 3.

3. The method of claim 1 wherein said gate silicon layer comprises polycrystalline silicon (polysilicon).

4. The method of claim 1 wherein said gate silicon layer comprises amorphous silicon.

5. The method of claim 1 wherein said dielectric gapfill layer comprises undoped silicon oxide.

6. The method of claim 1 wherein said doped silicon oxide layer comprises phosphosilicate glass (PSG).

7. The method of claim 1 wherein said first dielectric layer comprises borophosphosilicate glass (BPSG).

8. The method of claim 1 wherein said first dielectric layer comprises silicon oxide.

9. The method of claim 1 wherein said disposable gate layer comprises silicon nitride.

10. The method of claim 1 wherein said disposable gate layer comprises polycrystalline silicon (polysilicon).

11. The method of claim 1 whereby said doped silicon oxide layer is removed using anhydrous HF vapor etch.

12. The method of claim 11 whereby the anhydrous HF vapor etch has a selectivity of doped silicon oxide to an undoped silicon oxide layer of greater than 50:1.

13. The method of claim 1 wherein said disposable gate layer comprises polysilicon, and said disposable gate layer is removed using a plasma assisted etch with a selectivity of polysilicon to an undoped silicon oxide of at least 2:1 a selectivity of polysilicon to doped silicon oxide of at least 2:1, and a selectivity of polysilicon to a silicon nitride of at least 2:1.

14. The method of claim 1 wherein said disposable gate layer comprises silicon nitride, and is removed with the first silicon nitride layer.

15. The method of claim 1 which further includes, subsequent forming a metal gate layer, the steps of:
   l. planarizing said metal gate layer and said barrier layer using a chemical mechanical polishing process, stopping on said second silicon nitride layer;
   m. forming a second dielectric layer over said metal gate layer, said barrier layer and second silicon nitride layer; and
   n. patterning said second dielectric layer to form contact openings for said gate structure and patterning said second dielectric layer, second silicon nitride layer, first dielectric layer, first silicon nitride layer and said dielectric gapfill layer to form source and drain contact openings.

16. The method of claim 15 whereby the second dielectric layer comprises undoped silicon oxide.

17. The method of claim 15 whereby the second dielectric layer comprises doped silicon oxide.

18. The method of claim 10 wherein said first silicon nitride layer and said disposable gate layer are etched using HBR/CL$_2$/O$_2$, or CH$_2$F$_2$/O$_2$, or CH$_3$F/O$_2$ with a selectivity of first silicon nitride to doped silicon oxide of between about 10:1 and 30:1 and a selectivity of first silicon nitride to an undoped silicon oxide of between about 10:1 and 30:1.

19. The method of claim 6 which further includes subsequent of forming metal gate layer, the steps of:
   o. planarizing said metal gate layer and said barrier layer using a chemical-mechanical polishing process, stopping on said second silicon nitride layer.
   p. forming a second dielectric layer over said metal gate layer and said first dielectric layer; and
   q. patterning said second dielectric layer to form contact openings for said gate structure and patterning said second dielectric layer, said first dielectric layer, said first and second silicon nitride layers, and said dielectric gapfill layer to form self-aligned source and drain contact openings.

20. The method of claim 18 whereby the second dielectric layer comprises undoped silicon oxide.

21. The method of claim 18 whereby the second dielectric layer comprises doped silicon oxide.

* * * * *